United States Patent
Lee

(10) Patent No.: US 9,466,381 B2
(45) Date of Patent: Oct. 11, 2016

(54) SEMICONDUCTOR DEVICE

(71) Applicant: SK hynix Inc., Gyeonggi-do (KR)

(72) Inventor: Won Hee Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/321,532

(22) Filed: Jul. 1, 2014

(65) Prior Publication Data

US 2015/0221380 A1 Aug. 6, 2015

(30) Foreign Application Priority Data

Feb. 3, 2014 (KR) .................. 10-2014-0012205

(51) Int. Cl.
| | | |
|---|---|---|
| G11C 11/34 | (2006.01) | |
| G11C 16/14 | (2006.01) | |
| G11C 16/34 | (2006.01) | |
| G11C 16/10 | (2006.01) | |
| G11C 16/16 | (2006.01) | |
| G11C 16/04 | (2006.01) | |

(52) U.S. Cl.
CPC .............. *G11C 16/14* (2013.01); *G11C 16/10* (2013.01); *G11C 16/16* (2013.01); *G11C 16/3404* (2013.01); *G11C 16/3459* (2013.01); *G11C 16/0483* (2013.01); *G11C 16/3409* (2013.01)

(58) Field of Classification Search
CPC .............. G11C 16/10; G11C 16/0483; G11C 11/5628; G11C 16/14; G11C 27/005; G11C 2211/5621; G11C 2211/5646; G11C 2213/75; G11C 16/3445; G11C 2211/562; G11C 2211/5648; G11C 2211/5641; G11C 8/08
USPC ............ 365/185.03, 185.05, 185.11, 185.12, 365/185.14, 185.17, 185.18, 185.22, 365/185.23, 185.24, 185.29, 189.16
See application file for complete search history.

(56) References Cited

U.S. PATENT DOCUMENTS

| | | | | |
|---|---|---|---|---|
| 2010/0142285 A1* | 6/2010 | Aritome | ............. | G11C 16/3427 365/185.24 |
| 2013/0286744 A1* | 10/2013 | Chen | ........................ | G11C 7/06 365/185.21 |

FOREIGN PATENT DOCUMENTS

| | | |
|---|---|---|
| KR | 1020080069498 | 7/2008 |
| KR | 1020120133594 | 12/2012 |

* cited by examiner

*Primary Examiner* — Fernando Hidalgo
(74) *Attorney, Agent, or Firm* — IP & T Group LLP

(57) ABSTRACT

A semiconductor device includes a memory block including memory cells coupled between bit lines and a common source line and operated by voltages applied to word lines, and an operation control block suitable for performing an erase operation and a pre-program operation on the memory block, wherein the operation control block performs an erase level control operation after the erase operation is completed so that threshold voltages of the memory cells relatively close to the bit lines and threshold voltages of the memory cells relatively close to the common source line are distributed at different erase levels.

15 Claims, 9 Drawing Sheets

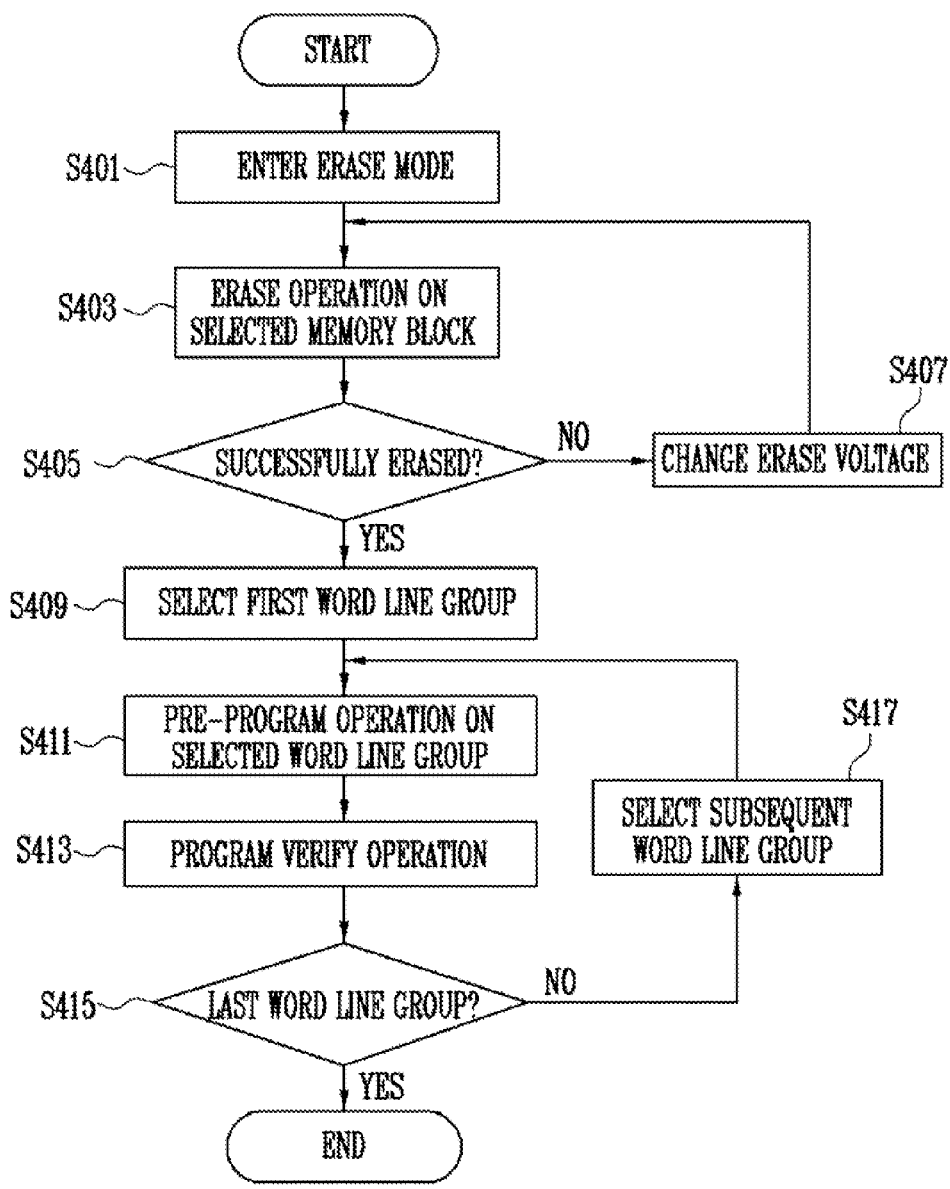

SEMICONDUCTOR DEVICE

CROSS-REFERENCE TO RELATED APPLICATION

The present application claims priority to Korean patent application number 10-2014-0012205, filed on Feb. 3, 2014, the entire disclosure of which is incorporated herein in its entirety by reference.

BACKGROUND

1. Field of Invention

Various embodiments of the present invention relate generally to a semiconductor device, and more particularly, to a semiconductor device including a memory block.

2. Description of Related Art

A NAND memory device is a typical non-volatile semiconductor memory device. A NAND memory device may include a plurality of memory blocks, and an erase operation of the NAND memory device may be performed on the respective memory blocks.

When an erase operation is performed, threshold voltages of memory cells included in the corresponding memory block are to be at an erase level. When threshold voltages of the erased memory cells have a relatively broad voltage distribution width, significant interference or disturbance may occur during a subsequent program operation. As a result, data storage characteristics may be deteriorated.

SUMMARY

Exemplary embodiments of the present invention are directed to a semiconductor device capable of improving operating characteristics.

A semiconductor device according to an embodiment of the present invention may include a memory block including memory cells coupled between bit lines and a common source line and operated by voltages applied to word lines, and an operation control block suitable for performing an erase operation on the memory block, wherein the operation control block performs an erase level control operation after the erase operation is completed so that threshold voltages of the memory cells relatively close to the bit lines and threshold voltages of the memory cells relatively close to the common source line are distributed at different erase levels.

A method of operating a semiconductor device according to an embodiment of the present invention may include grouping word lines, included in a memory block, into a first word line group relatively close to a common source line and a second word line group relatively close to bit lines, performing an erase operation on the memory block, controlling an erase level of memory cells included in the memory block, wherein a first memory cells included in the first word line group have an erase level higher than a second memory cells included in the second word line group, programming the first word line group, and programming the second word line group.

BRIEF DESCRIPTION OF THE DRAWINGS

FIG. 4 is a flow chart for describing a method of operating a semiconductor device according to an embodiment of the present invention;

DETAILED DESCRIPTION

Figure 1:
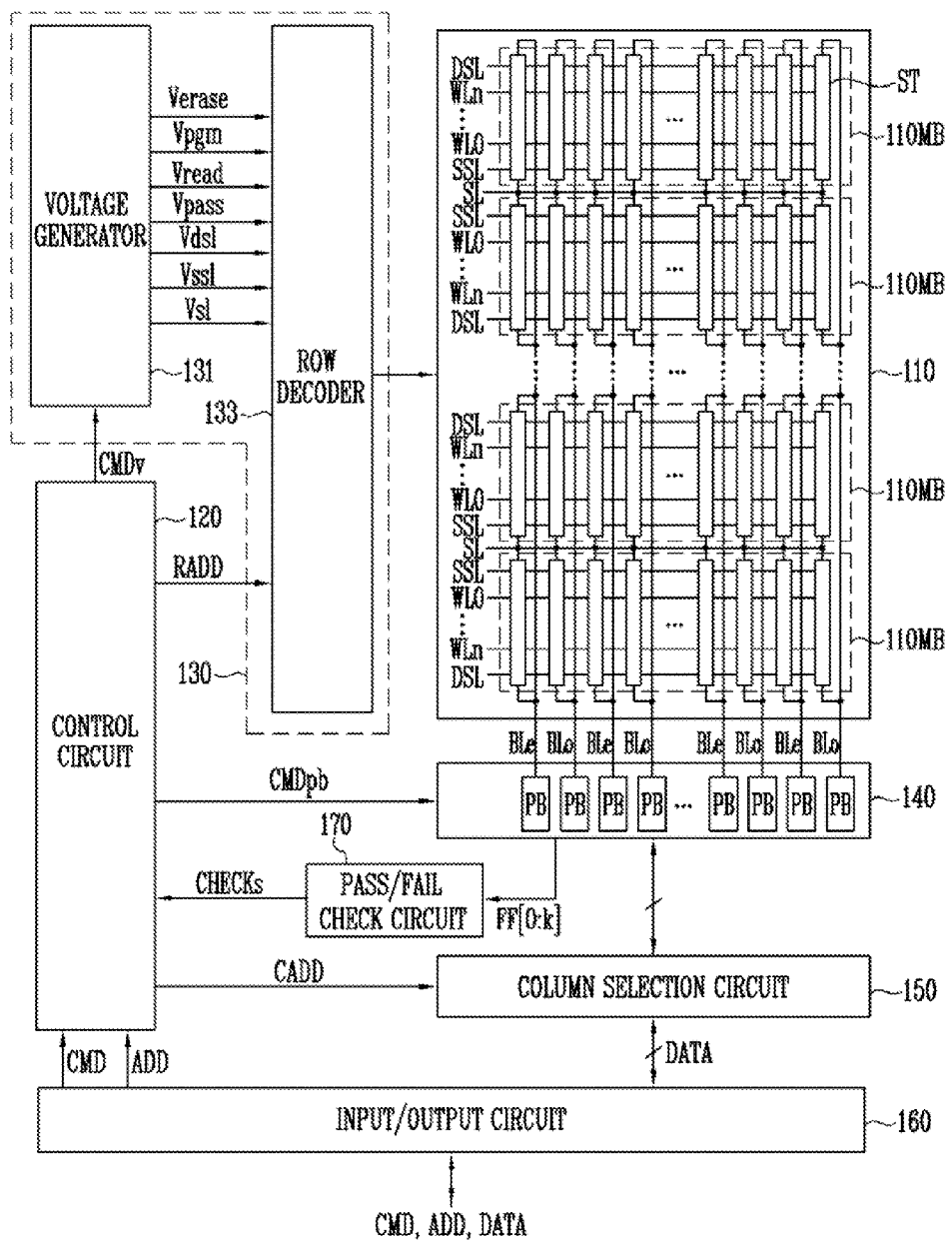
FIG. 1 is a block diagram illustrating a semiconductor device according to an embodiment of the present invention.

Hereinafter, various exemplary embodiments of the present invention will be described in detail with reference to the accompanying drawings. The figures are provided to enable those of ordinary skill in the art to make and use the present invention according to the exemplary embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specifically mentioned in a sentence.

Furthermore, 'include/comprise' or 'including/comprising' used in the specification represents that one or more components, steps, operations, and elements exists or are added.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is a view illustrating a semiconductor device according to an embodiment of the present invention.

Referring to FIG. 1, the semiconductor device may include a memory array 110 and an operation control block 120 to 170.

The memory array 110 may include a plurality of memory blocks 110 MB.

Figure 2:
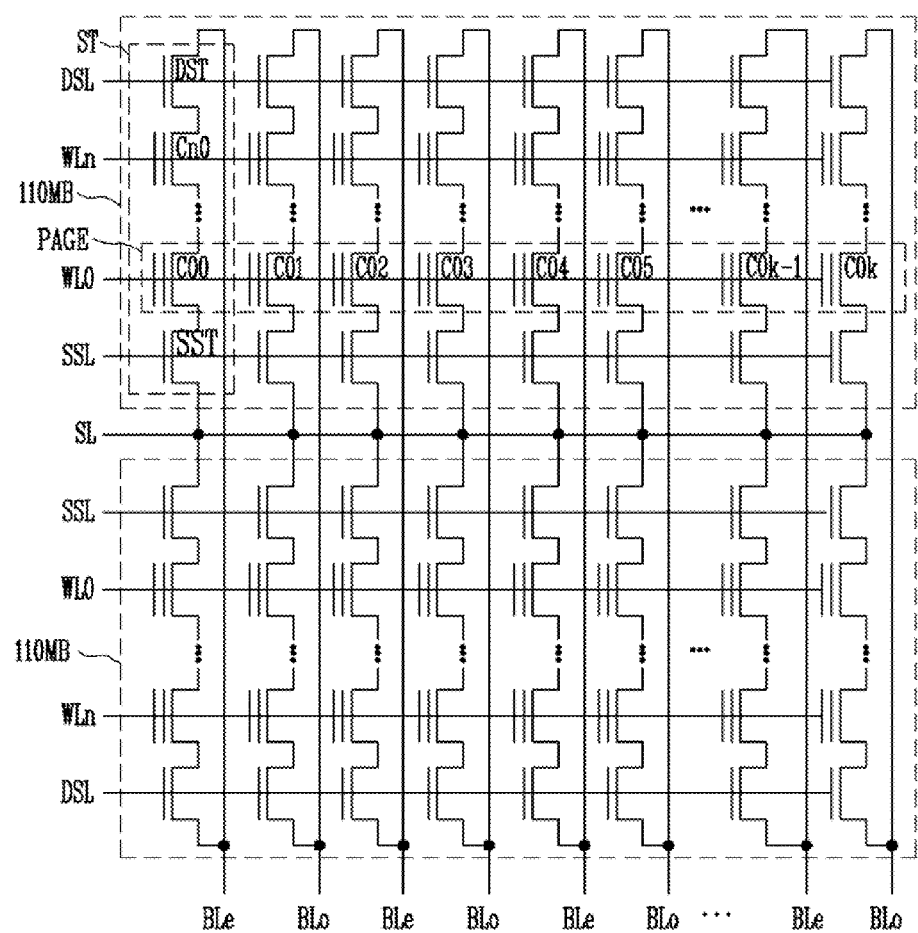
FIG. 2 is a detailed diagram of a memory array shown in FIG. 1.

FIG. 2 is a detailed diagram of the memory array shown in FIG. 1.

Referring to FIG. 2, each of the memory blocks 110 MB may include a plurality of memory strings ST coupled between bit lines BLe and BLo and a common source line SL. In other words, each of the memory strings ST may be coupled to each of the bit lines BLe and BLo corresponding thereto and coupled to the common source line SL. Each of the memory strings ST may include a source selection transistor SST having a source coupled to the common source line SL, a cell string including a plurality of memory cells C00 to Cn0 coupled in series with each other, and a drain selection transistor DST having a drain coupled to the bit line BLe or BLo. The memory cells C00 to Cn0, included in the cell string, may be coupled in series between the source and drain selection transistors SST and DST. A gate of the source selection transistor SST may be coupled to a source selection line SSL. Gates of the memory cells C00 to Cn0 may be coupled to word lines WL0 to WLn, respectively. A gate of the drain selection transistor DST may be coupled to the drain selection line DSL.

The drain selection transistor DST may control connection or disconnection between the cell string C00 to Cn0 and the bit line. The source selection transistor SST may control connection or disconnection between the cell string C00 to Cn0 and the common source line SL.

In a NAND flash memory device, memory cells included in a memory cell block may be divided into a physical page or a logical page. For example, memory cells C00 to C0k coupled to a single word line WL0 may form a single physical page PAGE. In addition, the even memory cells coupled to the word line WL0 may form an even page, and the odd memory cells may form an odd page. Such a page (or an even page and an odd page) may be a basic unit for a program operation or a read operation.

Figure 3A:
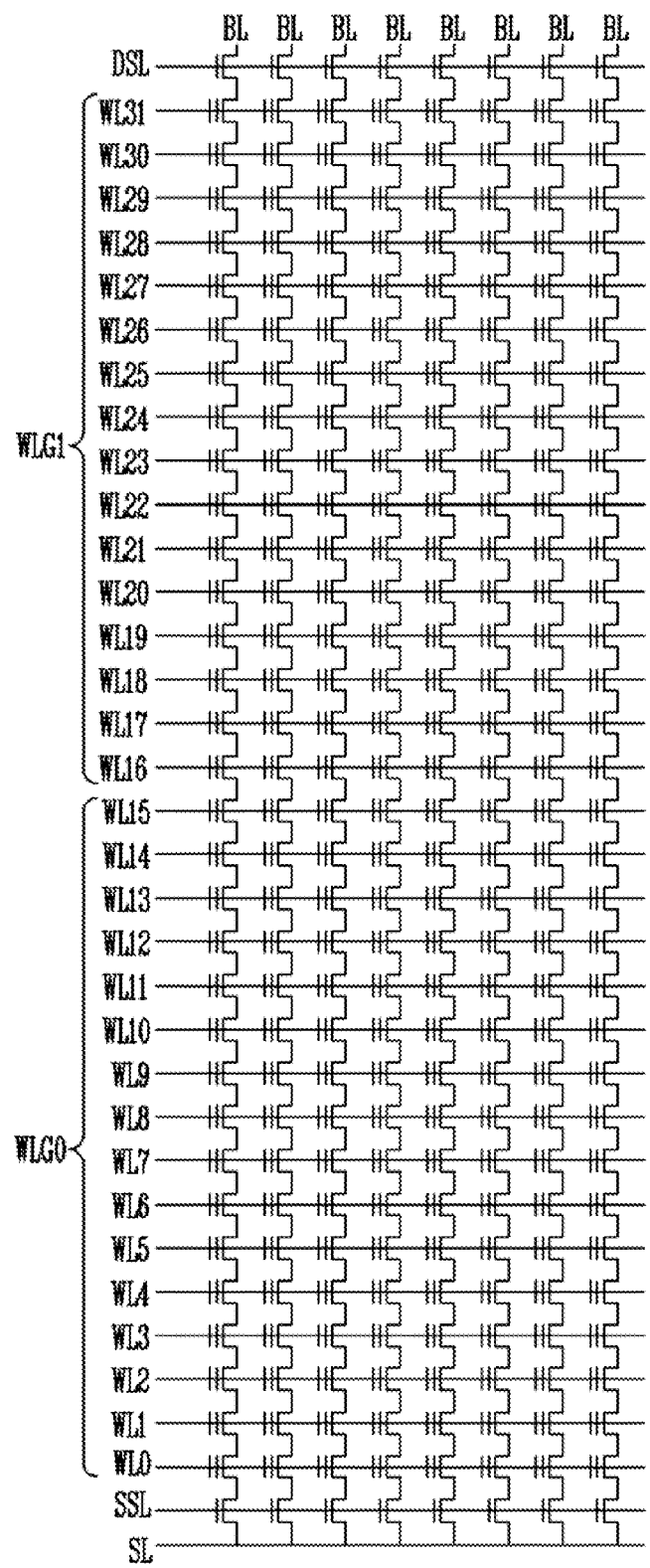
FIGS. 3A to 3C are circuit diagrams for describing examples of grouping word lines.
Figure 3B:
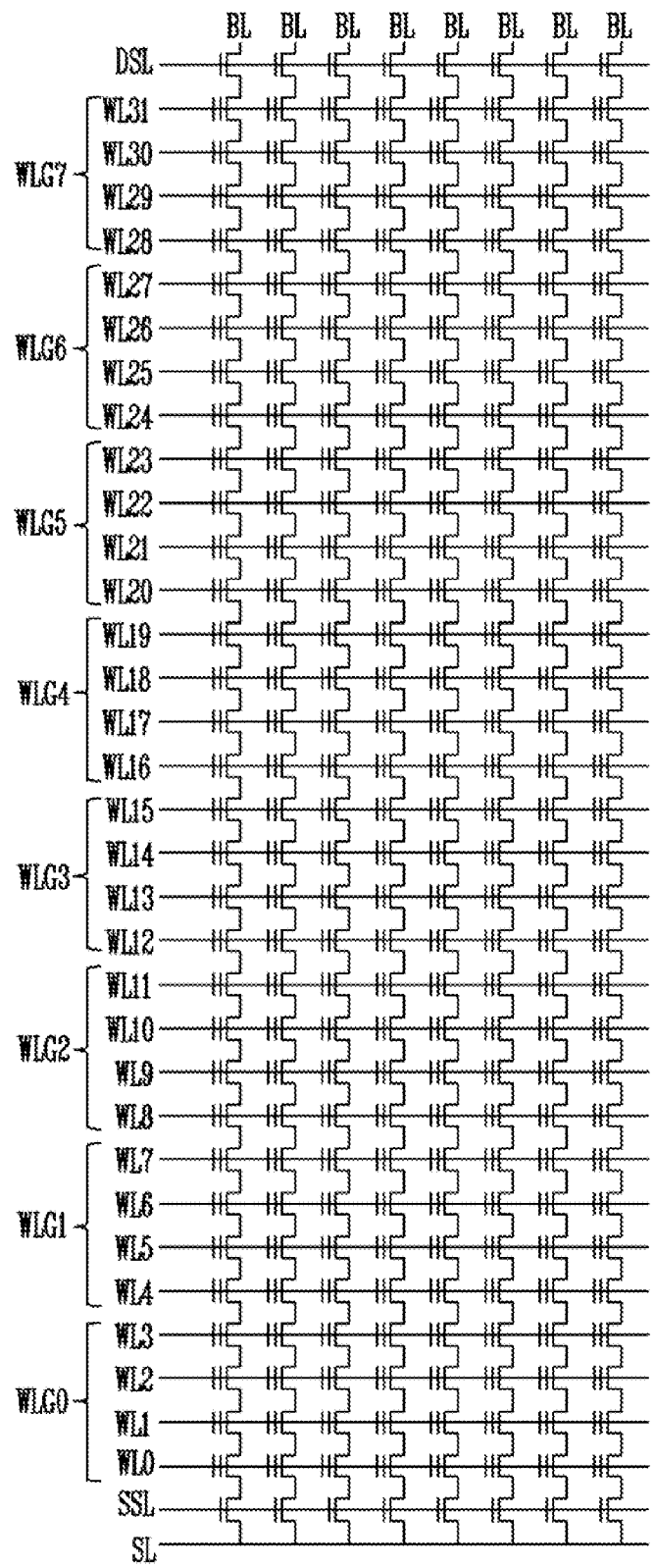
Figure 3C:
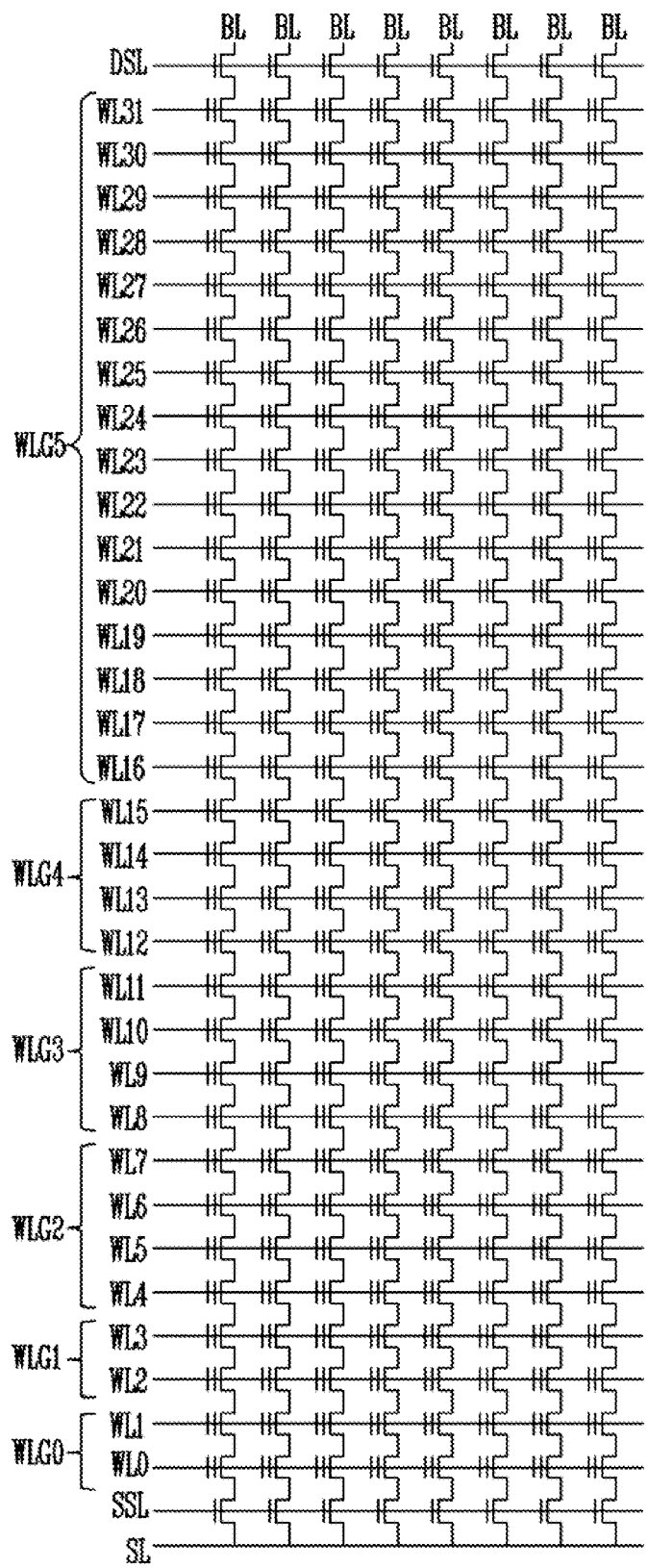

Word lines of a memory block may be grouped into a plurality of groups. FIGS. 3A to 3C are circuit diagrams for describing examples of grouping the word lines, shown in FIG. 2, into a plurality of groups.

Referring to FIG. 3A, word lines of a memory block may be grouped into two groups. When the memory block includes thirty-two word lines WL0 to WL31, first to sixteenth word lines WL0 to WL15 close to the source selection line SSL or the common source line SL may be grouped into a first word line group WLG0, and seventeenth to thirty second word lines WL16 to WL31 close to the drain selection line DSL or the bit line BL may be grouped into a second word line group WLG1.

Referring to FIG. 3B, word lines of a memory block may be grouped into a plurality of groups. For example, when the memory block includes the thirty-two word lines WL0 to WL31, the word lines WL0 to WL31 may be grouped into eight word line groups WLG0 to WLG7.

The first to fourth word line groups WLG0 to WLG3 may be close to the source selection line SSL or the common source line SL, and the fifth to eighth word line groups WLG4 to WLG7 may be close to the drain selection line DSL or the bit line BL.

In another example, the word lines WL0 to WL31 may be grouped into more or fewer than eight word line groups.

Referring to FIG. 3C, word lines may be assembled so that each of the word line groups may include different numbers of word lines. As a word line group is closer to the drain selection line DSL or the bit line BL, the word line group may include more word lines. As a word line group is farther from the source selection line SSL or the common source line SL, the word line group may include fewer word lines. For example, the word line group WLG5 may include the word lines WL16 to WL31, and the word line group WLG0 may include the word lines WL0 and WL1.

On the other hand, though not illustrated in FIG. 3C, a word line group may include fewer word lines as the word line group is closer to the drain selection line DSL or the bit line BL, and a word line group may include more word lines as the word line group is closer to the source selection line SSL or the common source line SL.

A description has been made in reference to the example in which there are 32 word lines. However, when there are 64, 128, 256, or more word lines, the word lines of the memory block may be grouped into various groups in substantially the same manner as described above. In addition, in a three-dimensional memory block where memory cells are coupled between a common source fine and a bit line substantially perpendicular to a semiconductor substrate, word lines of a memory block may also be assembled into various groups in substantially the same manner as described above.

Referring again to FIG. 1, the operation control block 120 to 170 may perform a program loop, an erase loop and a read operation on the memory cells coupled to a selected word line. The program loop may include a program operation and a verify operation, and the erase loop may include an erase operation and a verify operation. The operation control block 120 to 170 may perform the program operation (or post program operation) to control an erase level at which threshold voltages of the memory cells are distributed after the erase loop.

In order to perform a program loop, an erase loop and a read operation, the operation control block 120 to 170 may selectively output operating voltages Verase, Vpgin, Vread, Vpass, Vdsl, Vssl and Vsl to local lines SSL, WL0 to WLn and DSL of a selected memory block and the common source line SL control precharge/discharge of the bit lines BLe and BLo or sense a current flow through the bit lines BLe and BLo.

In a NAND flash memory, the operation control block may include a control circuit 120, a voltage supply circuit 130, a read/write circuit 140, a column selection circuit 150, an input/output circuit 160 and a pass/fail check circuit 170. Each of the components is described below.

The control circuit 120 may output a voltage control signal CMDv for controlling the voltage supply circuit 130 to generate the operating voltages Verase, Vpgm, Vread, Vpass, Vdsl, Vssl and VSL at desired levels for a program loop, an erase loop and a read operation in response to a command signal CMD, which is input from an external device through the input/output circuit 160. In addition, the control circuit 120 may output control signals CMDpb to control circuits PB included in the read/write circuit 140 for a program loop, an erase loop and a read operation. In addition, the control circuit 120 may output a column address signal CADD and a row address signal RADD when an address signal ADD is input.

The voltage supply circuit 130 may generate the operating voltages Verase, Vpgm, Vread, Vpass, Vdsl, Vssl and VSL necessary to perform a program loop, an erase loop and a read operation on the memory cells in response to the voltage control signal CMDv output from the control circuit 120. The voltage supply circuit 130 may output the operating voltages to the local lines SSL, WL0 to WLn and DSL of the selected memory block and the common source line SL in response to the row address signal RADD output from the control circuit 120.

The voltage supply circuit 130 may include a voltage generator 131 and a row decoder 133. The voltage generator 131 may generate the operating voltages Verase, Vpgm, Vread, Vpass, Vdsl, Vssl and VSL in response to the voltage control signal CMDv of the control circuit 120. The row decoder 133 may transfer the operating voltages to the local lines SSL, WL0 to WLn and DSL of the selected memory block, among the memory blocks 110 MB, and the common source line SL in response to the row address signal RAID output from the control circuit 120.

The voltage supply circuit 130 may output and change the operating voltages Verase, Vpgm, Vread, Vpass, Vdsl, Vssl and Vsl to be described below in response to the voltage control signal CMDv from the control circuit 120.

The read/rite circuit 140 may include a plurality of page buffers PB coupled to the memory array 110 through the bit lines BLe and BLo. Each of the page buffers PB may be coupled to each of the bit lines BLe and BLo. In other words, a single page buffer PB may be coupled to a single bit line. The page buffers PB may selectively precharge the bit lines BLe and BLo in response to a PB control signal CMDpb output from the control circuit 120 and data DATA to be stored in the memory cells during a program operation. The page buffers PB may precharge the bit lines BLe and BLo, sense a voltage variation or current of the bit lines BLe and BLo, and latch data read out from the memory cells in response to the PB control signal CMDpb output from the control circuit 120 during a program verify operation or a read operation.

Since each of the page buffers PB is coupled to each of the bit lines, a program operation, a read operation or a verify operation may be performed by an Even Odd Bit Line (EOBL) scheme in which memory cells of even bit lines and memory cells of odd bit lines are separately operated or an All Bit Line (ABL) scheme in which memory cells of even bit lines and memory cells of odd bit lines are simultaneously operated.

The page buffers PB may output verify check signals FF[0:k] to the pass/fail check circuit 170 on the basis of data latched from the memory cells of the selected page during a program verify operation or an erase verify operation.

The column selection circuit 150 may select the page buffers PB, included in the read/write circuit 140, in response to the column address CADD output from the control circuit 120. In other words, the column selection circuit 150 may sequentially transfer data, which is to be stored in the memory cells, to the page buffers PB in response to the column address CADD. In addition, the column selection circuit 150 may sequentially select the page buffers PB in response to the column address CADD so that data of the memory cells latched to the page buffers PB may be externally outputted during a read operation.

The input/output circuit 160 may transfer the command signal CMD and the address signal ADD, which are externally input, to the control circuit 120. In addition, the input/output circuit 160 may transfer the externally output data DATA to the column selection circuit 150 during a program operation or operate the data read out from the memory cells during a read operation.

The pass/fail check circuit 170 may perform program verify operation to determine program pass/fail or an erase verify operation to determine erase pass/fail and subsequently sense the amount of current depending on the check signals FF[0:k] output from the page buffers PB. The pass/fail check circuit 170 may output a check result value CHECKs to the control circuit 120 in response to the check signals FF[0:k].

After the erase operation is completed, the operation control block 120 to 170 of the semiconductor device may perform an erase level control operation so that the threshold voltages of memory cells close to the bit line and the threshold voltages of memory cells close to the common source line may be distributed at different erase levels. For example, after the erase operation is performed on the memory block, the operation control block 120 to 170 may perform a program operation and a program verify operation so that the threshold voltages of the memory cells close to the bit line and the threshold voltages of the memory cells close to the common source line may be distributed at different erase levels, which is described below in detail.

FIG. 4 is a flow chart for describing a method of operating a semiconductor device according, to an embodiment of the present invention. FIGS. 5A to 5E are diagrams illustrating cell threshold voltage distributions of a semiconductor device according to an embodiment of the present invention. A description is made below in reference to an example in which a program operation is performed in a multi level cell (MLC) method where two bits of data are stored in a unit cell. However, the following operating method is also applicable to a program operation performed in a triple level cell (TLC) method in which three bits of data are stored in a unit cell, or a quad level cell (QLC) method in which four bits of data are stored in a unit cell.

Figure 5A:
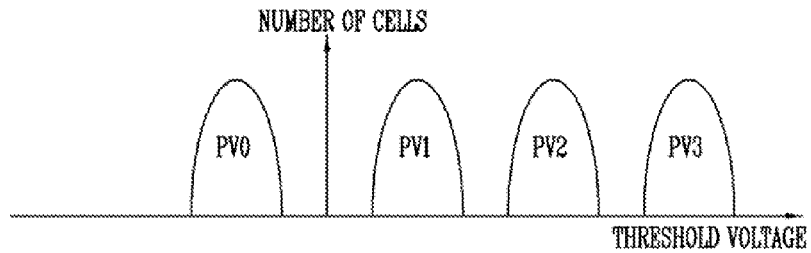
FIGS. 5A to 5E are diagrams illustrating cell threshold voltage distributions of a semiconductor device according to an embodiment of the present invention.

Referring to FIGS. 3A, 4 and 5A, threshold voltages of memory cells storing the two-bit data per unit cell may be divided into an erase level PV0 and three program levels PV1 to PV3 depending on data to be stored in the memory cells. When a command signal and an address are input from an external controller (not illustrated), the semiconductor device may enter an erase mode at step S401.

Figure 5B:
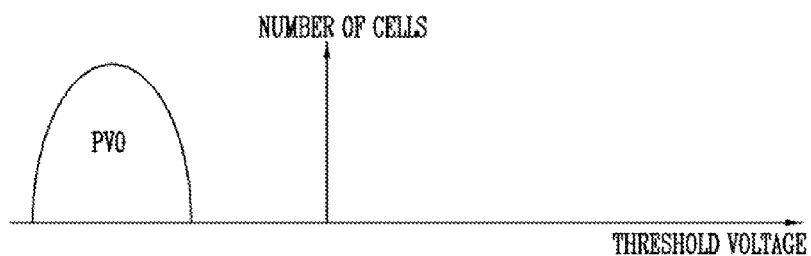

Referring to FIGS. 3A, 4 and 5B, an erase loop may be performed on the selected memory block at steps S403, S405 and S407. The erase loop may be performed using an increment step pulse erase (ISPE) method. First, at step S403, an erase operation may be performed on the selected memory block. The voltage supply circuit may apply voltages for the erase operation to the selected memory block in order to perform the erase operation under the control of the control circuit.

For example, a ground voltage (i.e., 0V) may be applied to the word lines WL0 to WL31, and an erase voltage may be applied to a bulk (i.e., a substrate or a P-well) of the memory cells. Since such operating conditions are known in the art, a description thereof will be omitted. The drain and source selection lines DSL and SSL may be set to a floating state during the erase operation.

Electrons injected into floating gates of the memory cells may migrate into the bulk due to a high voltage difference between the word line and the bulk. As a result, the threshold voltages of the memory cells may be reduced.

As for a memory cell having a silicon-oxide-nitride-oxide-silicon (SONOS) structure or a tantalum-aluminum-oxide-nitride-oxide-silicon (TANOS) structure including a charge storage layer formed of a nitride layer, instead of a floating gate including polysilicon, or a memory cell having a three-dimensional structure including a charge storage layer formed of a nitride layer on a surface of a vertical channel layer, when an erase operation is performed, threshold voltages of the memory cells may be reduced due to a high voltage difference between a word line and a bulk.

An erase verify operation may be performed in order to check whether the erase operation is successful at step S405. In other words, it may be checked whether the threshold voltages of the memory cells have decreased to a target level. The control circuit may control the voltage supply circuit to apply voltages for the erase verify operation to a memory block. The control circuit may control the read/write circuit to sense voltage variations of bit lines. The read/rite circuit may output verify check signals in response to a sensing result to the pass/fail check circuit. The pass/fail check circuit may output a check result value to the control circuit in response to the verify check signals. The control circuit may check whether the erase operation is successful according to the check result value.

When it is determined that the erase operation fails, the erase voltage may be changed at step S407. In other words, the erase voltage may be changed to a higher level. Subsequently, the erase operation may be performed again by using the changed erase voltage at step S403. When the erase operation is performed, the threshold voltages of the memory cells, included in the memory block, may be distributed at the erase level PV0.

When it is determined that the erase operation is successful at step S405, the threshold voltages of the memory cells close to the bit line and the threshold voltages of the memory cells close to the common source line may be distributed at different erase levels, at steps S409, S411, S413, S415 and S417. Threshold voltages (or erase level) of memory cells coupled to word lines, (e.g., the word lines WL0 to WL15) of the first word line group WLG0 may be controlled first. These steps may be performed in a substantially similar manner to a program operation. Through these steps, a distribution width of the threshold voltages of the erased memory cells may be reduced, and threshold voltages of overerased cells may also be controlled.

Referring to FIGS. 3A, 4 and 5B, the first word line group WLG0 may be selected at step S409. For example, the first word line group WLG0, which is the closest to the source selection line, may be selected.

Figure 5C:
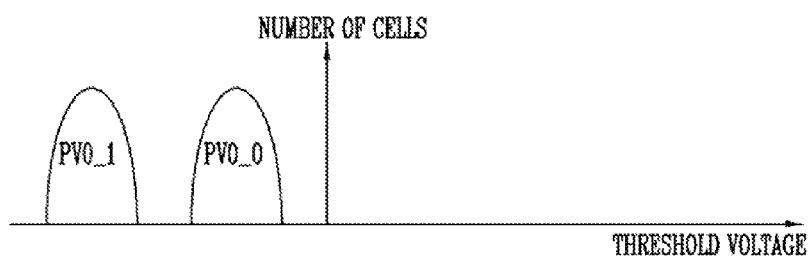

Referring to FIGS. 3A, 4 and 5C, a pre-program operation may be performed on the first word line group WLG0 at step S411. In order to perform the pre-program operation, a first voltage may be applied to word lines (e.g., WL0 to WL15) of the first word line group WLG0, and a second voltage lower than the first voltage may be applied to word lines (e.g., WL16 to WL31) of the unselected second word line group WLG1. For example, the voltage supply circuit may apply a pre-program voltage (e.g., 9V to 12V) to the word lines (e.g., WL0 to WL15) of the first word line group (e.g., WLG0) and apply a pass voltage (e.g., 7V to 8V) to the word lines (e.g., WL16 to WL31) of the second word line group WLG1.

Electrons may be injected into floating gates of first memory cells coupled to the word lines WL0 to WL15 of the first word line group WLG0 by the first voltage (or program voltage), and threshold voltages of the first memory cells may be increased. The program operation may be performed not to store data but to control the erase level PV0_0 of the first memory cells on which the erase operation is completed.

The erase level PV0_0 of the first memory cells included in the first word line group WLG0 may be increased by the program operation of the first word line group WLG0. In addition, the erase level PV0_1 of the second memory cells included in the second word line group WLG1 may be located in a lower region than the erase level PV0_0 of the first memory cells.

Figure 5D:
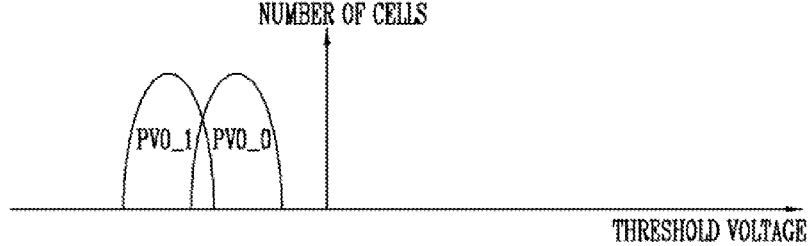

Referring to FIGS. 3A, 4 and 5D, the threshold voltages (or erase level of the second memory cells coupled to the word lines WL16 to WL31 of the second word line group WLG1 close to the drain selection line may be controlled at step S413. Similarly, the threshold voltages of the second memory cells may be controlled not to store data but to control the erase level of the second memory cells. The erase level of the second memory cells may be controlled by performing an additional program operation (e.g., a pre-program operation on the word lines WL16 to WL31 of the second word line group WLG1) or through a verify operation of the program operation of the first memory cells.

When the erase level of the second memory cells is controlled by the additional program operation, the program operation may be performed in substantially the same manner as the program operation of the first memory cells. Thus, a detailed description thereof is omitted. An example in which the erase level of the second memory cells is controlled through a program verify operation (i.e., a pre-program verify) is described below.

In order to perform the program verify operation, a third voltage may be applied to the word lines WL16 to WL31 of the second word line group WLG1 close to the drain selection line, and a second voltage lower than the third voltage may be applied to the word lines WL0 to WL15 of the first word line group WLG0 close to the source selection line. The third voltage may be a pass voltage equal to the second voltage applied to the second word line group WLG1 during the program operation of the first word line group WLG0. For example, the voltage supply circuit may apply the pass voltage (e.g., 7V to 8V) to the word lines WL16 to WL31 of the second word line group WLG1 and apply a verify voltage (e.g., 0V to 1V) to the word lines WL0 to WL15 of the first word line group WLG0.

The program operation at step S411 and the program verify operation at step S413 may be completed when the erase level PV0_0 of the memory cells of the first word line group WLG0 increases to a target level.

It may be determined whether there is a subsequent word line group on which a program operation is to be performed at step S415. When the word line group on which the program operation is performed is not the last word line group, among the word line groups on which the program operation is performed, a subsequent word line group may be selected at step S417, and then steps S411, S413 and S415 may be performed.

More specifically, during the program operation at step S411 or the program verify operation at step S413 performed after the erase operation, only the second or third voltage, which corresponds to the pass voltage, may be applied to the memory cells close to the drain selection line (or bit line). Therefore, since the threshold voltages of the memory cells of the second word line group WLG1 are increased only by pass disturbance, the threshold voltages thereof may be increased less than those of the first memory cells of the first word line group WLG0.

When the operation of controlling the erase levels of the erased memory cells is completed, the erase level PV0_0 of the first memory cells of the first word line group WLG0 may be higher than the erase level PV0_1 of the second memory cells of the second word line group WLG1.

As described above, advantages of setting a threshold voltage distribution (or erase level PV0_0) of the memory cells close to the source selection line (or common source line) to be higher than a threshold voltage distribution (or erase level PV0_1) of the memory cells close to the drain selection line (or bit line) are as follows.

Figure 5E:
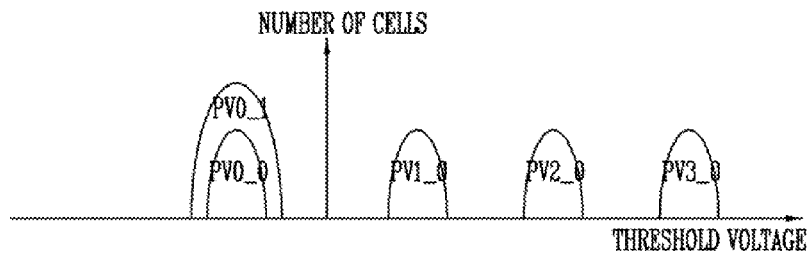

Referring to FIGS. 3A and 5E, a program operation may be performed to store data in the memory block on which the erase level is completely controlled after the erase operation. Program operations may be performed on respective pages. In general, a program operation may be performed on memory cells of a word line (or page) close to the source selection line (or common source line). In other words, the program operations may be first performed on the first memory cells coupled to the word lines WL0 to WL15 coupled to the first word line group WLG0. Whenever the program operation is performed on the first memory cells, a pass voltage may continue to be applied to the second memory cells coupled to the word lines WL16 to WL31 of the second word line group WLG1. Therefore, pass disturbance may occur in the second memory cells, and the erase level PV0_1 of the second memory cells may be gradually increased.

When the program operations performed on the first memory cells of the first word line group WLG0 are completed, the erase level PV0_1 of the second memory cells of the second word line group WLG1 may become similar to the erase level PV0_0 of the first memory cells prior to the program operation. Therefore, the program operations of the second memory cells of the second word line group WLG1 may be performed when the erase level PV0_1 of the second memory cells is similar to the erase level PV0_0 of the first memory cells. Therefore, the difference between program operation characteristics of the second memory cells and program operation characteristics of the first memory cells may be reduced and operating characteristics may be improved. Here, PV1_0 to PV3_0 denote program levels of the first memory cells after the program operations of the second memory cells.

Subsequently, when the program operations performed on the first memory cells of the first word line group WLG0 are completed, the threshold voltages of the memory cells included in the memory block may be divided into the erase level PV0 and the three program levels PV1 to PV3 as illustrated in FIG. 5A.

Figure 6:
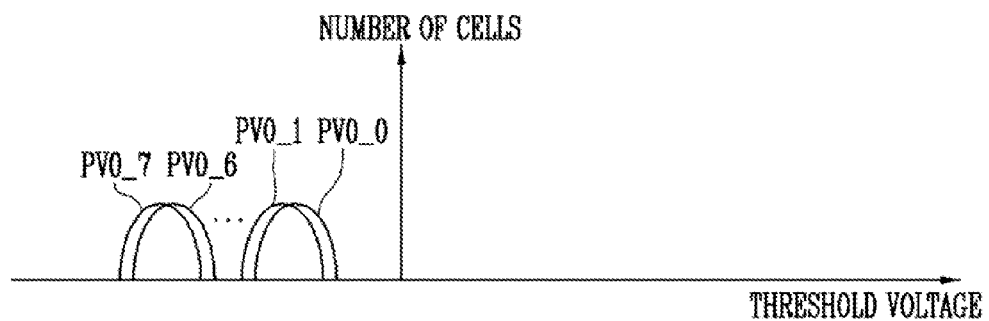
FIG. 6 is a diagram illustrating a cell threshold voltage distribution of a semiconductor device according to an embodiment of the present invention.

An example in which the word lines are divided into two groups has been described. However, as illustrated in FIGS. 3B and 3C, the word lines may be divided into a plurality of groups. FIG. 6 is a diagram illustrating cell threshold voltage distributions of a semiconductor device according to an embodiment of the present invention.

Referring to FIGS. 3A and 6, when word lines are divided into two or more word line groups, erase levels of memory cells included in a memory block may be divided according to the number of word line groups. For example, erase levels PV0_0 to PV0_7 may be divided into the word line groups WLG0 to WLG7. In this example, program operations may be performed on the word line groups WLG0 to WLG7 under different conditions. In other words, a pre-program voltage applied to word lines of a selected word line group may be controlled by a position of the selected word line group without changing a pass voltage applied to word lines of unselected word line groups.

For example, as the selected word line group (e.g., WLG0) is closer to the source selection line SSL or the common source line SL, a high pre-program voltage may be applied to the word lines WL0 to WL3 of the selected word line group WLG0. In addition, as the selected word line group (e.g. WLG6) is closer to the drain selection line DSL or the bit line BL a low program voltage may be applied to the word lines WL24 to WL27 of the selected word line group WLG6.

When the program operation is performed under the above-described conditions, program operations may be performed on all the word line groups WLG0 to WLG7 at substantially similar erase levels as described in FIG. 5E.

Figure 7:
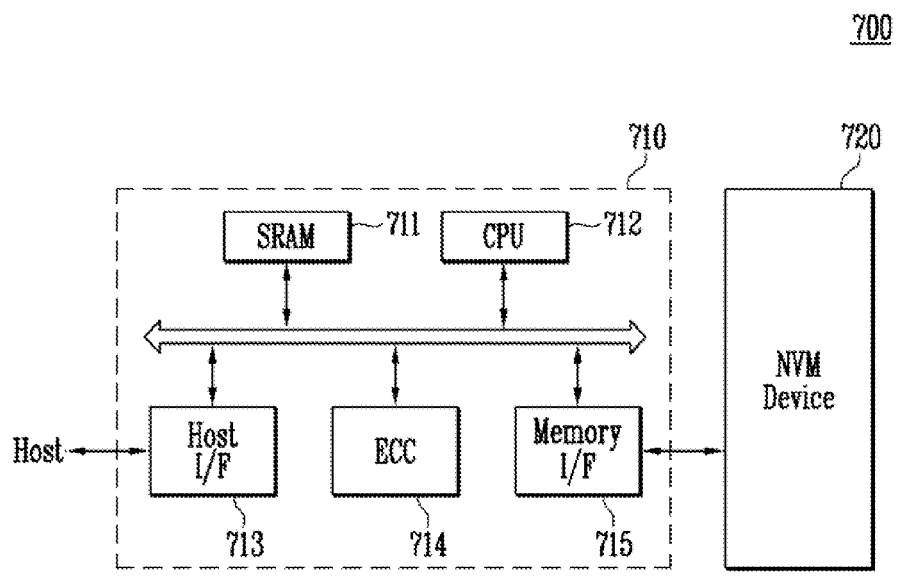
FIG. 7 is a block diagram illustrating a memory system according to an embodiment of the present invention.

FIG. 7 is a block diagram illustrating a memory system 700 according to an embodiment of the present invention.

As illustrated in FIG. 7, the memory system 700 may include a non-volatile memory (NVM) device 720 and a memory controller 710.

The non-volatile memory device 720 may include the above-described semiconductor memory. In addition, the memory controller 710 may output the command signal and the address signal as described above at step S401 in FIG. 4 to the non-volatile memory device 720. The non-volatile memory device 720 may perform operations at steps S401 to S415 described above in FIG. 4 in response to the command signal and the address signal.

In other words, the memory controller 710 may control the non-volatile memory device 720. The memory controller 710 may be a solid-state disk (SSD) or a memory card in which the non-volatile memory device 720 and the memory controller 710 are combined. A static random access memory (SRAM) 711 may function as a working memory of a central processing unit (CPU) 712. A host interface (I/F) 713 may include a data exchange protocol of a host being coupled to the memory system 700. An error correction circuit (ECC) 714 may detect and correct errors included in data read from the non-volatile memory device 720. A memory interface (I/F) 715 may interface with the non-volatile memory device 720. The central processing unit 712 may perform the general control operations for data exchange of the memory controller 710.

Though not shown in FIG. 7, the memory system 700 may further include a read only memory (ROM) that stores code data to interface with the host. In addition, the non-volatile memory device 720 may be a multi-chip package including a plurality of flash memory chips. The memory system 700 having the above-described configuration may be provided as a storage medium having high reliability and low error rate. When a flash memory device according to an embodiment of the present invention is provided in a memory system such as a semiconductor disk device (e.g., an SSD), the memory controller 710 may communicate with an external device (e.g., a host) through one of various interface protocols, such as USB, MMC, PCI-E, SATA, PATA, SCSI, ESDI and IDE.

Figure 8:
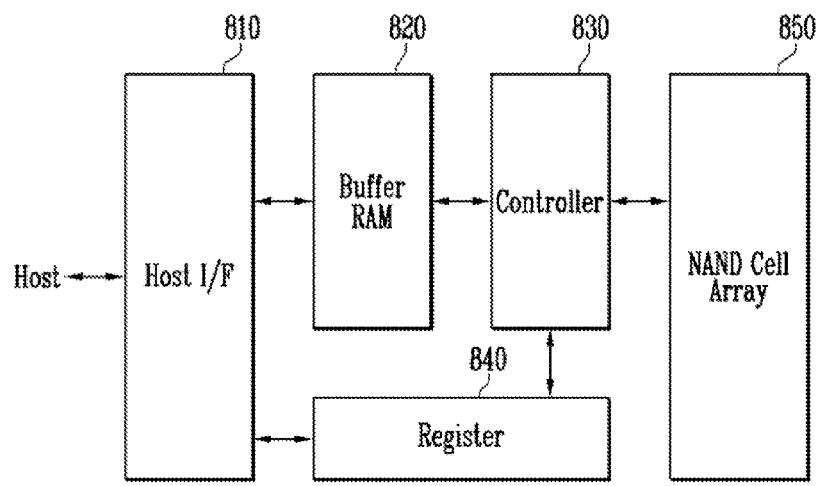
FIG. 8 is a block diagram illustrating a fusion memory device or a fusion memory system performing an operation according to the embodiments.

FIG. 8 is a block diagram illustrating a fusion memory device or a fusion memory system performing an operation according to the embodiments of the present invention. For example, technical features of the present invention may be applied to a OneNAND flash memory device 800 as a fusion memory device.

The OneNand flash memory device 800 may include a host interface (I/F) 810, a buffer random access memory (RAM) 820, a controller 830, a register 840 and a NAND flash cell array 850. The host interface 810 may exchange various types of information with a device using different protocols. The buffer RAM 820 may be loaded with codes for driving the memory device or temporarily storing data. The controller 830 may control read and program operations at every state in response to a control signal and a command that are externally given. The register 840 may be configured to store data including instructions, addresses and configurations defining a system operating environment in the memory device. The NAND flash cell array 850 may include operating circuits including non-volatile memory cells and page buffers. The memory array shown in FIG. 2 may be used as a memory array of the NAND flash cell array 850.

Figure 9:
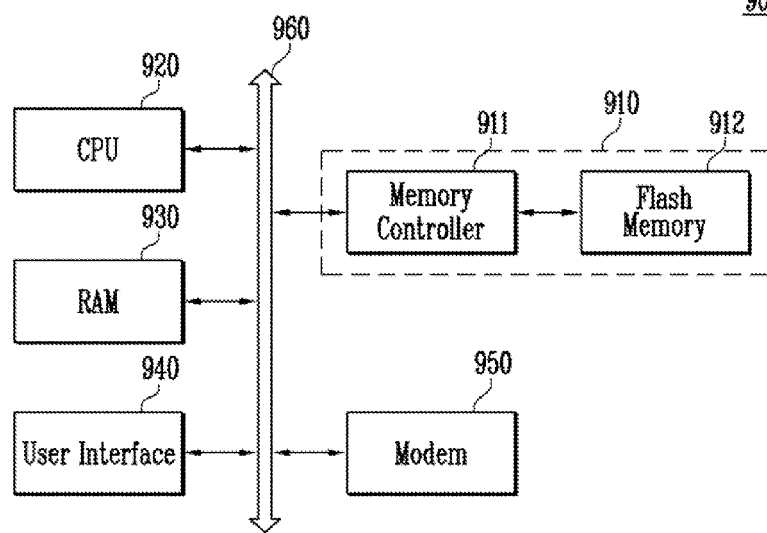
FIG. 9 is a block diagram illustrating a computing system including a flash memory device according to an embodiment of the present invention.

FIG. 9 is a block diagram illustrating a computing system 900 according to an embodiment of the present invention. The computing system 900 may include a flash memory device 912.

The computing system 900 may include a microprocessor e.g. CPU 920, a RAM 930, a user interface 940, a modem 950, such as a baseband chipset, and a memory system 910, all of which are electrically coupled to a system bus 960. In addition, when the computing system 900 is a mobile device, a battery (not illustrated) may be further included to apply an operating voltage to the computing system 900. Though not shown in FIG. 9, the computing system 900 may further include application chipsets a camera image processor and mobile DRAM. The memory system 910 may include a memory controller 911 and the flash memory device 912. The memory system 910 may form a solid-state drive/disk (SSD) that uses a non-volatile memory device in order to store data. Alternatively, the memory system 910 may be provided as a fusion memory flash memory (e.g., OneNAND flash memory).

According to an embodiment of the present invention, operating characteristics may be improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A semiconductor device, comprising:
a memory block including memory cells coupled between bit lines and a common source line and operated by voltages applied to word lines; and
an operation control block suitable for performing an erase operation on the memory block,
wherein the operation control block performs an erase level control operation including a pre-program operation by applying voltages, different from the voltages applied to the word lines close to the common source line, to the word lines close to the bit lines, after the erase operation is completed, to distribute threshold voltages of the memory cells relatively close to the bit lines to be different from threshold voltages of the memory cells relatively close to the common source line.

2. The semiconductor device of claim 1, wherein the word lines are grouped into a first word line group relatively close to the common source line and a second word line group relatively close to the bit lines.

3. The semiconductor device of claim 2, wherein the operation control block performs the erase level control operation so that a second erase level of the memory cells included in the second word line group is lower than a first erase level of the memory cells of the first word line group.

4. The semiconductor device of claim 2, wherein when the erase level control operation is performed on the first word line group, the operation control block applies a first voltage to the word lines of the first word line group and a second voltage lower than the first voltage to the word lines of the second word line group.

5. The semiconductor device of claim 4, wherein when the erase level control operation is performed on the second word line group, the operation control block applies a third voltage to the word lines of the second word line group and a fourth voltage lower than the third voltage to the word lines of the first word line group.

6. The semiconductor device of claim 5, wherein the second voltage is equal to the third voltage.

7. The semiconductor device of claim 2, wherein the erase level control operation is performed on the first word line group by the pre-program operation of the operation control block.

8. The semiconductor device of claim 7, wherein when the pre-program operation is performed on the first word line group, a program voltage is applied to a selected word line of the first word line group, and a pass voltage is applied to the second word line group.

9. The semiconductor device of claim 2, wherein the operation control block applies a pre-program voltage to first memory cells included in the first word line group to control an erase level of the first memory cells, and the operation control block applies a pass voltage to second memory cells included in the second word line group to control an erase level of the second memory cells.

10. The semiconductor device of claim 1, wherein the word lines are grouped into three or more word line groups.

11. The semiconductor device of claim 10, wherein more word lines are included in a word line group relatively close to the bit lines than those included in the a word line group relatively close to the common source line.

12. The semiconductor device of claim 10, wherein the number of erase levels of the memory cells corresponds to the number of word line groups.

13. The semiconductor device of claim 10, wherein the operation control block performs pre-program operations under different conditions to control erase levels of the memory cells included in the word line groups.

14. The semiconductor device of claim 13, wherein the operation control block changes a pre-program voltage depending on a position of each word line group between the bit lines and the common source line.

15. The semiconductor device of claim 14, wherein a first pre-program voltage is applied to the memory cells of the word line group relatively close to the common source line, and a second pre-program voltage, which is lower than the first pre-program voltage, is applied to the memory cells of the word line group relatively close to the bit lines.

* * * * *